(12) United States Patent
Zhang et al.

(10) Patent No.: US 12,225,832 B2
(45) Date of Patent: Feb. 11, 2025

(54) METHOD FOR FABRICATING AIR BRIDGE, AIR BRIDGE STRUCTURE, AND SUPERCONDUCTING QUANTUM CHIP

(71) Applicants: TENCENT TECHNOLOGY (SHENZHEN) COMPANY LIMITED, Guangdong (CN); SUZHOU INSTITUTE OF NANO-TECH & NANO-BIONICS (SINANO), CHINESE ACADEMY OF SCIENCES, Jiangsu (CN)

(72) Inventors: Wenlong Zhang, Guangdong (CN); Sainan Huai, Guangdong (CN); Yarui Zheng, Guangdong (CN); Jiagui Feng, Guangdong (CN); Kanglin Xiong, Guangdong (CN); Sunan Ding, Guangdong (CN)

(73) Assignees: TENCENT TECHNOLOGY (SHENZHEN) COMPANY LIMITED, Shenzhen (CN); SUZHOU INSTITUTE OF NANO-TECH & NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 307 days.

(21) Appl. No.: 17/704,717

(22) Filed: Mar. 25, 2022

(65) Prior Publication Data
US 2022/0216390 A1    Jul. 7, 2022

Related U.S. Application Data

(63) Continuation of application No. PCT/CN2021/121480, filed on Sep. 28, 2021.

(30) Foreign Application Priority Data

Nov. 20, 2020 (CN) .......................... 202011309305.2

(51) Int. Cl.
*H10N 60/83* (2023.01)
*H10N 60/01* (2023.01)
(Continued)

(52) U.S. Cl.
CPC .......... *H10N 60/83* (2023.02); *H10N 60/0884* (2023.02); *H10N 60/81* (2023.02); *H10N 60/82* (2023.02); *H10N 69/00* (2023.02)

(58) Field of Classification Search
None
See application file for complete search history.

(56) References Cited

U.S. PATENT DOCUMENTS

| | | | | |
|---|---|---|---|---|
| 5,686,743 A | * | 11/1997 | Lammert | .......... H01L 21/76885 |
| | | | | 257/776 |
| 2019/0089033 A1 | * | 3/2019 | Adiga | ................... H01P 11/003 |

(Continued)

FOREIGN PATENT DOCUMENTS

| CN | 1725505 A | 1/2006 |
|---|---|---|
| CN | 101373734 A | 2/2009 |

(Continued)

OTHER PUBLICATIONS

Supplementary European Search Report issued Sep. 25, 2023 in Application No. 21815877.2 ( 14 pages).

(Continued)

*Primary Examiner* — Benjamin P Sandvik
(74) *Attorney, Agent, or Firm* — ArentFox Schiff LLP

(57) ABSTRACT

This disclosure includes a method for fabricating an air bridge, an air bridge structure, and a superconducting quantum chip, and relates to the field of circuit structures. In some examples, a method for fabricating an air bridge includes forming an air bridge brace structure on a substrate, and forming, on the air bridge brace structure and the substrate, an air bridge material layer with one or more (Continued)

openings in the air bridge material layer that reveal the air bridge brace structure. The air bridge material layer with the one or more openings is formed based on a patterned photoresist layer with patterns corresponding to the one or more openings. The method further includes removing, based on the one or more openings in the air bridge material layer, the air bridge brace structure to obtain the air bridge having the one or more openings.

13 Claims, 7 Drawing Sheets

(51) Int. Cl.
　　*H10N 60/81*　　(2023.01)
　　*H10N 60/82*　　(2023.01)
　　*H10N 69/00*　　(2023.01)

(56) References Cited

U.S. PATENT DOCUMENTS

| | | | |
|---|---|---|---|
| 2020/0381609 A1* | 12/2020 | Megrant | G06N 10/00 |
| 2021/0265261 A1* | 8/2021 | Chan | H10N 69/00 |
| 2023/0320046 A1* | 10/2023 | Tada | H05K 9/00 |
| | | | 174/125.1 |

FOREIGN PATENT DOCUMENTS

| | | |
|---|---|---|
| CN | 111063657 A | 4/2020 |
| EP | 4012757 A1 | 6/2022 |
| JP | H04-111422 A | 4/1992 |
| JP | H04215458 A | 8/1992 |
| JP | H0590872 A | 4/1993 |
| JP | H088340 A | 1/1996 |
| JP | H09270464 A | 10/1997 |
| JP | 2007536747 A | 12/2007 |
| KR | 20190045362 A | 5/2019 |

OTHER PUBLICATIONS

Korean Office Action issued May 3, 2023 in Application No. 10-2022-7017843 (15 pages).

Lankwarden Y J Y et al: "Development of NbTiN—Al Direct Antenna Coupled Kinetic Inductance Detectors", Journal of Low Temperature Physics, Kluwer Academic Publishers-Consultants Bureau, Ne, vol. 167, No. 3-4, Jan. 20, 2021, pp. 367-372.

International Search Report issued Dec. 31, 2021 in Application No. PCT/CN2021/121480, with English Translation, pp. 1-10.

Office Action received for European Patent Application No. 21815877.2, mailed on Jun. 14, 2024, 8 pages.

* cited by examiner

METHOD FOR FABRICATING AIR BRIDGE, AIR BRIDGE STRUCTURE, AND SUPERCONDUCTING QUANTUM CHIP

RELATED APPLICATIONS

This application is a continuation of International Application No. PCT/CN2021/121480, entitled "METHOD FOR FABRICATING AIR BRIDGE, AIR BRIDGE STRUCTURE, AND SUPERCONDUCTING QUANTUM CHIP" and filed on Sep. 28, 2021, which claims priority to Chinese Patent Application No. 202011309305.2, entitled "METHOD FOR FABRICATING AIR BRIDGE, AIR BRIDGE STRUCTURE, AND SUPERCONDUCTING QUANTUM CHIP" filed on Nov. 20, 2020. The entire disclosures of the prior applications are hereby incorporated by reference in their entirety.

FIELD OF THE TECHNOLOGY

Embodiments of this disclosure relate to the field of circuit structures, including a method for fabricating an air bridge, an air bridge structure, and a superconducting quantum chip.

BACKGROUND OF THE DISCLOSURE

An air bridge is a type of circuit structure, which is a way of implementing planar circuit bridging using a three-dimensional bridge structure and is applicable to various chips. Since the medium between the bridge and a circuit is air or vacuum, the bridge is referred to as an air bridge or a vacuum bridge.

In the process of fabricating an air bridge, a support needs to be fabricated first to support the bridge. The support is referred to as a bridge brace material. In the related art, in the process of fabricating an air bridge, a non-photoresist bridge brace material (such as silica and zinc oxide) is used. A bridge material is deposited on an upper portion of the bridge brace material, and a photoresist is then coated, exposed, and developed. A protective glue is covered at a position on the photoresist corresponding to the air bridge structure, and the bridge material at the remaining positions is etched off. Then, all of the photoresist is removed by using a glue remover. Finally, the bridge brace material is released, to obtain an air bridge.

However, in the process of fabricating an air bridge, especially, a fully-enclosed air bridge, using the above method, a large amount of bridge brace residues are easily left inside the bridge hole during the release of the bridge brace material due to the long longitudinal length of the bridge, seriously affecting the quality of the device.

SUMMARY

Embodiments of this disclosure provide a method for fabricating an air bridge, an air bridge structure, and a superconducting quantum chip, to improve the fabrication accuracy and quality of the air bridge.

In some examples, a method for fabricating an air bridge includes forming an air bridge brace structure on a substrate, and forming, on the air bridge brace structure and the substrate, an air bridge material layer with one or more openings in the air bridge material layer that reveal the air bridge brace structure. The air bridge material layer with the one or more openings is formed based on a patterned photoresist layer with patterns corresponding to the one or more openings. The method further includes removing, based on the one or more openings in the air bridge material layer, the air bridge brace structure to obtain the air bridge having the one or more openings.

Some aspects of the disclosure provide an electronic device that includes a substrate and an air bridge formed on the substrate. The air bridge includes one or more openings in a deck of the air bridge, such as in an approach bridge portion of the air bridge, in a pier portion of the air bridge, in a bridge top portion of the air bridge and the like.

According to another aspect, a superconducting quantum chip is provided, including a substrate and a quantum circuit integrated on the substrate. The superconducting quantum chip further includes the air bridge structure according to the foregoing aspects.

The technical solutions provided in the embodiments of this disclosure achieve at least the following beneficial effects:

By performing exposure patterning treatment on a patterned photoresist, an opening structure running through a deck is arranged on the deck. In the process of fabricating an air bridge, a bridge brace material is released through the opening structure, and an etching material is released from a position of an opening to etch the bridge brace material. Therefore, the complete release of the bridge brace material is ensured, and bridge brace material residues are prevented from being left inside the bridge hole, thereby improving the overall device quality of the air bridge and the fabrication accuracy of the air bridge.

In addition, a plurality of different opening manners can satisfy fabrication of fully-enclosed air bridges with different requirements. Two different methods for fabricating an air bridge are provided to satisfy air bridge solutions with different fabrication requirements. The damage of an etching gas to other devices caused by an excessively long release time of a bridge brace in a related process is avoided. The bridge brace release process has a good effect, and the composition of the etching gas does not need to be changed. The etching gas can be released through the opening to achieve the release of the bridge brace without leaving bridge brace residue. The whole process does not cause damage to other devices and structures on the substrate, and maintains the good shape and performance of a sample. Compared with the design without an opening, the design with an opening introduced can avoid structural damage, such as a dent or a fracture, at the straight and curved portions of the fully-enclosed air bridge. The methods are applicable to fabricating an air bridge of a flip-chip (FC), particularly to fabricating a fully-enclosed air bridge of a superconducting quantum FC.

BRIEF DESCRIPTION OF THE DRAWINGS

To describe the technical solutions of the embodiments of this disclosure more clearly, the following briefly introduces the accompanying drawings required for describing the embodiments. The accompanying drawings in the following description show some embodiments of this disclosure.

DESCRIPTION OF EMBODIMENTS

To make the objectives, technical solutions, and advantages of this disclosure clearer, the following further describes exemplary implementations of this disclosure in detail with reference to the accompanying drawings.

An air bridge is a circuit structure, configured to implement planar circuit bridging using a three-dimensional bridge structure. The air bridge is a structure manufactured by using a micro-nano processing method. The introduction of an air bridge structure to a circuit can resolve the problems such as cross-bonding between low inductance and low fringe capacitance, and has enormous advantages compared with wire bonding technologies. The key to the fabrication of an air bridge is to ensure a firm structure, with which the air bridge can maintain its shape without collapse, fracture, or the like in a high-temperature and vibrating environment.

The air bridge is applicable to various chips, for example, an FC. Using a superconducting quantum chip as an example, adding an air bridge structure to a superconducting circuit at a proper position has the following advantages: 1. The impedance matching of a chip link is effectively improved. 2. The wiring space of a qubit sample is increased. 3. Some lossy devices or processes are transferred out of a bit area to improve bit decoherence under complex processes. 4. The isolation between bit controls is increased. Particularly, in an FC, the isolation between a substrate and a top plate can be effectively increased.

The FC technology refers to a technology in which an integrated circuit (IC) chip faces downward and is directly interconnected to a package shell or a wiring substrate. A chip obtained through the FC process is referred to as an FC.

A bridge brace refers to a support that needs to be fabricated in advance in the process of fabricating an air bridge. That is, when fabricating the air bridge, the bridge brace needs to be fabricated first. An air bridge structure is made based on the bridge brace, and the bridge brace is released to obtain an independent air bridge. The bridge brace matches the air bridge in shape. That is, the bridge brace matches a bridge hole portion of the air bridge in shape, so as to deposit a bridge material on the bridge brace, and to obtain an air bridge that is hollow at the bridge hole portion after the bridge brace is released.

In this embodiment of this disclosure, an opening is arranged on a deck of the air bridge. The opening is a hole structure artificially designed and added to release the bridge brace material, and is distributed at a bridge top, a pier, and an approach bridge of the air bridge. The concept of opening is provided in this embodiment of this disclosure.

Figure 1:
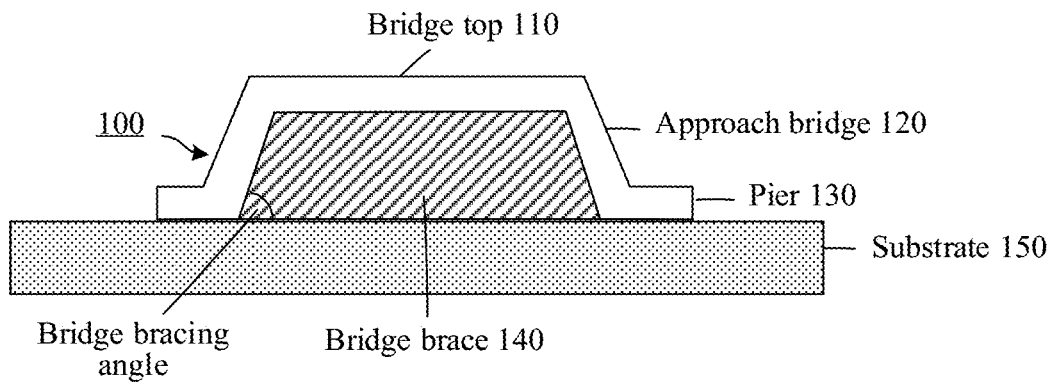
FIG. 1 is a schematic cross-sectional structural diagram of an air bridge according to an exemplary embodiment of this disclosure.

Illustratively, FIG. 1 is a schematic cross-sectional structural diagram of an air bridge 100 according to an exemplary embodiment of this disclosure. As shown in FIG. 1, a structure of the air bridge 100 includes a bridge top 110, an approach bridge 120, a pier 130, and a bridge brace 140 introduced in a fabrication process. The air bridge 100 is entirely located on a substrate 150. After the bridge brace 140 is released, the air bridge 100 is obtained. In addition, an original region of the bridge brace 140 becomes an air or vacuum region. A region that is run through by the air or vacuum region is a bridge hole of the air bridge 100.

Figure 2:
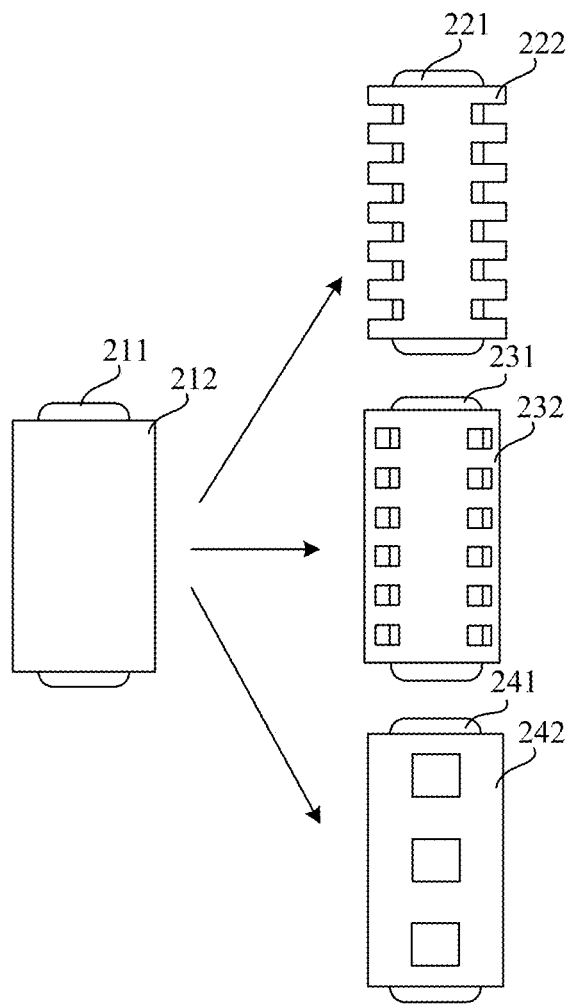
FIG. 2 is a top view of openings at different positions on an air bridge according to an exemplary embodiment of this disclosure.

FIG. 2 is a top view of openings at different positions on an air bridge according to an exemplary embodiment of this disclosure. As shown in FIG. 2, an air bridge 212 on a bridge brace 211 is an air bridge without an opening; an air bridge 222 on a bridge brace 221 is an air bridge with an opening at pier and approach bridge portions; an air bridge 232 on a bridge brace 231 is an air bridge with an opening at an approach bridge portion; and an air bridge 242 on a bridge brace 241 is an air bridge with an opening at a bridge top portion.

In some embodiments, when the openings at the pier, approach bridge, and bridge top portions are through, a complete fully-enclosed air bridge is divided into a plurality of separated air bridges. Separated air bridges indicate that the air bridges are not connected to each other, and each are an independent air bridge. A fully-enclosed air bridge means that a series of air bridges are connected to each other by components to form an air bridge as a whole.

In the related art, the methods for fabricating a superconducting air bridge are mainly glue-based methods. That is, a photoresist is fabricated into an arch shape by using the reflow property of the photoresist. A material is then deposited on a top of the photoresist. Secondary coating, exposure, and development are performed. A protective glue is covered at a position of an air bridge structure. The material at the remaining positions is etched off. Finally, all of the photoresist is removed with a glue remover to obtain an air bridge.

However, many process steps are included for the superconducting quantum FC. To reduce the impact of the process on a junction device serving as a bit, the air bridge structure is fabricated in the early stage of the FC process, which means that it is necessary to ensure that the air bridge is not damaged during many subsequent processes. Therefore, it is necessary to use a non-photoresist bridge brace, and keep the bridge brace in the subsequent processes until the bridge brace is released before the final FC process. However, in the method, for a common fully-enclosed air bridge in a superconducting circuit, because of the long longitudinal length of the bridge, when the bridge brace is released, it is likely that a large amount of bridge brace residue is left inside a bridge hole, seriously affecting the quality of the device.

In the related art, the release accuracy of the bridge brace is increased by improving the etching process. In the improved etching process, the effect of releasing the bridge brace is improved using methods such as changing the composition of an etching gas, adjusting an etching time, and detecting the composition of an exhaust gas after etching. However, it is still difficult to effectively remove a bridge brace material deep in a bridge hole. In conclusion, disadvantages are as follows:

1. Generally, an additional gas path needs to be added to equipment to modify the composition of the etching gas, which involves the difficulty of equipment modification.

2. An additional detection device is required for detecting the composition of the exhaust gas, which increases costs.

3. The method of adjusting the etching time by detecting the composition of the exhaust gas may prolong the etching time, which has relatively large impact on the performance of the junction device on a superconducting chip.

4. The modification of the composition of the etching gas involves inflammable and explosive gases such as methanol, which poses hidden dangers to the safety of the production workshop or laboratory.

In addition, a fully-enclosed air bridge without an opening is likely to cause unevenness of the deck such as bumps, dents, undulations, and the approach bridge is also likely to break.

Figure 3:
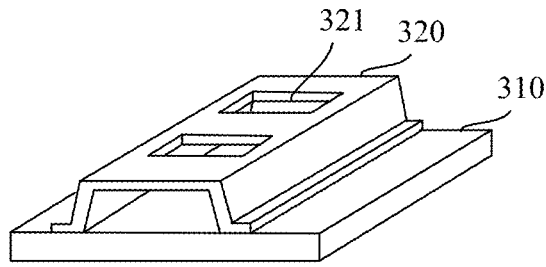
FIG. 3 is a schematic diagram of an air bridge structure according to an exemplary embodiment of this disclosure.

With reference to the foregoing descriptions, first, descriptions are provided for the air bridge structure included in the embodiments of this disclosure. FIG. 3 shows a schematic diagram of an air bridge structure 300 according to an exemplary embodiment of this disclosure. The air bridge structure 300 includes a substrate 310 and a bridge body 320.

The bridge body 320 is located on the substrate 310, and an opening 321 running through a deck of the bridge body 320 is provided on the deck.

In some embodiments, the deck includes at least one of a pier portion, an approach bridge portion, or a bridge top portion, and a position of the opening includes any one of the following situations:

First, the opening is located at the approach bridge portion.

Second, the opening is located at the approach bridge portion and the pier portion.

Third, the opening is located at the bridge top portion (the opening 321 shown in FIG. 3).

Fourth, the opening is located at the bridge top portion and the approach bridge portion.

Fifth, the opening is located at the bridge top portion, the approach bridge portion, and the pier portion.

In this embodiment of this disclosure, the positions of the opening mainly included are: the approach bridge portion, the approach bridge portion and the pier portion, and the bridge top portion.

As described above, in the air bridge structure provided in this embodiment, an opening structure running through a deck is arranged on the deck. Therefore, in the process of fabricating an air bridge, a bridge brace material can be released through the opening structure, and an etching material is released from a position of an opening to etch the bridge brace material. Therefore, the complete release of the bridge brace material is ensured, and bridge brace material residues are prevented from being left inside the bridge hole, thereby improving the overall device quality of the air bridge and the fabrication accuracy of the air bridge.

Figure 4:
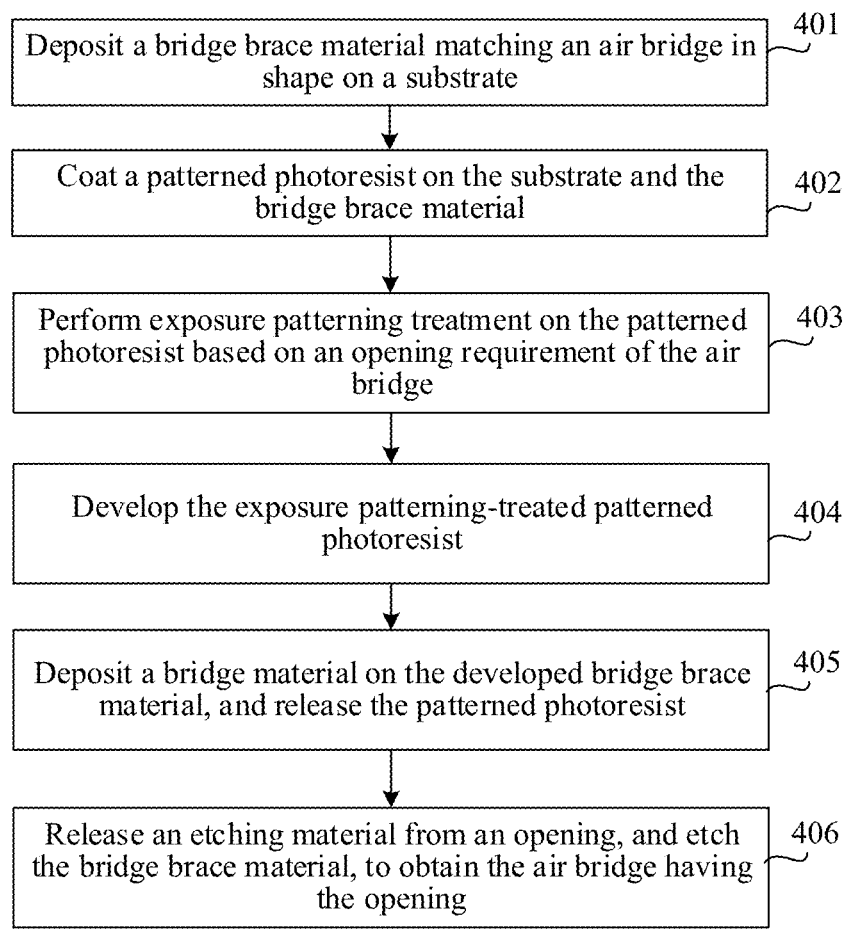
FIG. 4 is a flowchart of a method for fabricating an air bridge according to an exemplary embodiment of this disclosure.

FIG. 4 is a flowchart of a method for fabricating an air bridge according to an exemplary embodiment of this disclosure. As shown in FIG. 4, the fabrication process of the air bridge includes the following steps:

At Step 401. A bridge brace material matching the air bridge in shape is deposited on a substrate.

The bridge brace material matches the air bridge in shape, that is, by depositing a bridge material on the bridge brace material, an air bridge with an accurate bridge body shape can be directly obtained.

In some examples, the bridge brace material is a silica material or zinc oxide.

In some embodiments, in the process of depositing the bridge brace material, a patterned photoresist needs to be coated on the substrate first. The patterned photoresist is used for obtaining a deposition region of the bridge brace material through exposure and development. That is, according to a position of the air bridge on the substrate, the patterned photoresist is exposed and developed, to obtain the deposition region of the bridge brace material, and the bridge brace material matching the air bridge in shape is deposited in the deposition region on the substrate.

In some embodiments, a primer photoresist is coated on the substrate first, and the patterned photoresist is coated on the primer photoresist. A development manner of the primer photoresist is different from that of the patterned photoresist, that is, the primer photoresist does not react with a developer of the patterned photoresist. According to the position of the air bridge on the substrate, the patterned photoresist is exposed and developed. After the deposition region of the bridge brace material is obtained, the primer photoresist located in the deposition region also needs to be etched, and the bridge brace material matching the air bridge in shape is deposited in the deposition region on the substrate. Due to the region control of the primer photoresist, shape control of the bridge brace material in the deposition region has higher flexibility and a better effect.

Figure 5:
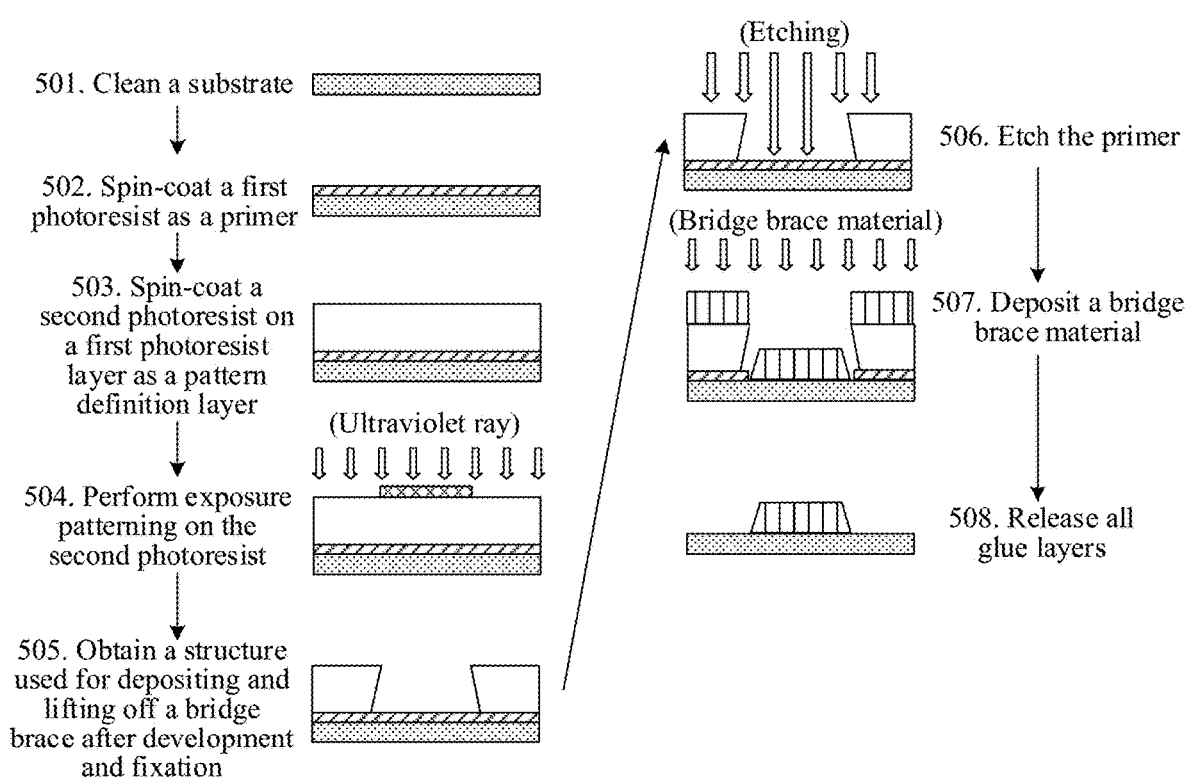
FIG. 5 is an exemplary schematic diagram of a depositing process of a bridge brace material according to the embodiment shown in FIG. 4.

Illustratively, in the process of depositing the bridge brace material, the steps shown in FIG. 5 are included:

At Step 501. The substrate is cleaned. The cleaning manner includes at least one of organic cleaning or inorganic cleaning. The organic cleaning refers to cleaning with acetone, isoacetone, or deionized water, and inorganic cleaning refers to cleaning with phosphoric acid, sulfuric acid, or a piranha solution. In some examples, the cleaning method includes at least one of ultrasonic cleaning or heating cleaning.

At Step 502. A first photoresist is spin-coated as a primer.

After spin-coating, first baking is performed on the first photoresist. The temperature of the first baking is the soft baking temperature of the first photoresist. The first photoresist is a polymethyl methacrylate (PMMA) photoresist.

At Step 503. A second photoresist is spin-coated on the first photoresist layer as a pattern definition layer.

The first photoresist does not react with a developer of the second photoresist. In some examples, the second photoresist layer has an opposite light sensitive property from the first photoresist layer. In an example, the first photoresist layer is positive photoresist, and the second photoresist is negative photoresist.

Second baking is performed on the second photoresist. The temperature of the second baking is the soft baking temperature of the second photoresist.

At Step 504. Exposure patterning is performed on the second photoresist.

The exposure process includes ultraviolet exposure or laser direct writing, and the baking temperature is a prebaking temperature of the second photoresist.

At Step 505. A structure used for depositing and lifting off a bridge brace after development and fixation is obtained.

At Step 506. The primer is etched.

The etching method for etching the primer includes physical etching, chemical etching, or a combination of physical etching and chemical etching. The physical etching includes ion beam etching, and the ion beam used is argon ions. The chemical etching includes plasma etching, and the atmosphere is oxygen and/or argon.

At Step 507. A bridge brace material is deposited. The method for depositing the bridge brace material is a depositing method with good directionality control such as electron beam evaporation and thermal evaporation.

At Step 508. All glue layers are released (removed). That is, the first photoresist and the second photoresist mentioned above are released. When the first photoresist and the second photoresist are lifted off the substrate, the lift-off is completed through one-time lift-off or two-time lift-off. When a glue remover or lift-off solution of the first photoresist is the same as that of the second photoresist, one-time lift-off is performed; otherwise, two-time lift-off is performed. The temperature during the lift-off is 20° C. to 100° C.

At Step 402. A patterned photoresist is coated on the substrate and the bridge brace material.

In some embodiments, the patterned photoresist is the second photoresist shown in FIG. 5. That is, the second photoresist is coated on the bridge brace material and the substrate again.

Alternatively, in some other embodiments, a third photoresist is coated on the substrate and the bridge brace material as the patterned photoresist mentioned above, and the temperature of third baking is a soft baking temperature of the third photoresist. The third photoresist and the second photoresist are different photoresists. The third photoresist is a negative or reversal photoresist.

At Step 403. Exposure patterning treatment is performed on the patterned photoresist based on an opening requirement of the air bridge.

The opening requirement includes a position requirement of an opening on a deck of the air bridge. In this embodiment of this disclosure, the opening on the air bridge mainly involves three positions: 1. an approach bridge portion; 2. the approach bridge portion and a pier portion; and 3. a bridge top portion. In this embodiment of this disclosure, in view of different positions of the opening, two fabrication methods are provided.

A method A and a method B are described. In the method A, the patterned photoresist is directly exposed and patterned to obtain an opening structure, so as to obtain an air bridge having the opening after deposition of the bridge material.

In the method B, a region on the patterned photoresist corresponding to the bridge brace material is exposed, to obtain a patterned complete bridge region. The bridge material is deposited. Then, the photoresist used for fabricating an opening is patterned to perform opening arrangement again. Finally, the bridge material is etched through an opening region of the photoresist used for fabricating an opening, to obtain the opening on the air bridge.

Therefore, in this embodiment, performing exposure patterning treatment on the patterned photoresist based on the opening requirement has two meanings:

The first meaning (determining to use the method A or the method B): When the position of the opening is the approach bridge portion or the approach bridge portion and the pier portion, and it is required to use the foregoing method A as the fabrication method, the patterning manner of the method A is used to perform exposure patterning treatment on the patterned photoresist.

When the position of the opening is the approach bridge portion, or the approach bridge portion and the pier portion, or the bridge top portion, and it is required to use the foregoing method B as the fabrication method, the patterning manner of the method B is used to perform exposure patterning treatment on the region corresponding to the bridge brace material.

The second meaning (an exposure patterning region when the method A is used): When the patterning manner of the method A is used to perform exposure patterning treatment, a corresponding region is exposed according to a specific arranged position of the opening.

The exposure patterning treatment refers to covering a mask on the patterned region on the patterned photoresist and applying light to the patterned photoresist. The patterned region is a region other than the position of the opening, and the position of the opening is a position on the patterned photoresist corresponding to the opening on the air bridge.

The exposure process includes ultraviolet exposure or laser direct writing, and the baking temperature is a prebaking temperature of the patterned photoresist. Patterns in the patterning process include a separated air bridge pattern and a fully-enclosed air bridge pattern, where the fully-enclosed air bridge is an air bridge having an opening pattern at the pier portion and/or the approach bridge portion.

The separated air bridge pattern refers to exposing a section of patterned photoresist every predetermined distance, so as to obtain a plurality of separated air bridges. The fully-enclosed air bridge pattern having an opening refers to performing exposure patterning on the opening at the pier and/or approach bridge portion every predetermined distance, so as to obtain the fully-enclosed air bridge having an opening arranged every predetermined distance.

That is, in some embodiments, the air bridge is a fully-enclosed air bridge, and one or a set of openings are arranged on the fully-enclosed air bridge every predetermined distance.

At Step 404. The exposure patterning-treated patterned photoresist is developed.

In some examples, by developing the exposure patterning-treated patterned photoresist, patterned etching of the patterned photoresist is finished. The developing process includes a development step and a fixation step, where the development step is used for visualizing an exposure-patterned portion, and the fixation step is used for fixing the exposure-patterned portion.

At Step 405. A bridge material is deposited on the developed bridge brace material, and the patterned photoresist is released (removed).

In some examples, the bridge material is implemented as an aluminum material. In some embodiments, the exposure patterning-treated patterned photoresist includes at least two of the following situations:

1. When the foregoing method A is used for performing opening arrangement, in the exposure patterning-treated patterned photoresist, the photoresist at the position at which an opening needs to be arranged is retained, and the photoresist at other positions at which the bridge material needs to be deposited is developed. In this way, after the bridge material is deposited, the air bridge having an opening is directly obtained.

2. When the foregoing method B is used for performing opening arrangement, in the exposure patterning-treated patterned photoresist, the patterned photoresist on both sides of the bridge brace material is retained, and the patterned photoresist at the position at which the air bridge structure is located is developed. In this way, after the bridge material is deposited, an air bridge having no opening structure is obtained. By further coating the photoresist on the air bridge having no opening structure for patterning, an opening region is obtained. Then, the bridge material in the opening region is etched to obtain an opening.

At Step 406. An etching material is released (let in) from the opening, and the bridge brace material is etched, to obtain the air bridge having the opening.

In some embodiments, an etching gas is released from the position of the opening to the inside of the air bridge, and the bridge brace material is etched by using the etching gas, so as to obtain a hollow air bridge having an opening.

As described above, in the method for fabricating an air bridge provided in this embodiment, exposure patterning treatment is performed on a patterned photoresist, so as to arrange an opening structure running through a deck on the deck. In addition, in the process of fabricating an air bridge, a bridge brace material is released through the opening structure, and an etching material is released from the position of an opening to etch the bridge brace material. Therefore, the complete release of the bridge brace material is ensured, and bridge brace material residues are prevented from being left inside the bridge hole, thereby improving the overall device quality of the air bridge and the fabrication accuracy of the air bridge.

Two methods for fabricating an air bridge are provided above, namely, the method A and the method B. In the following embodiments, descriptions are respectively provided for the method A and the method B.

Figure 6:
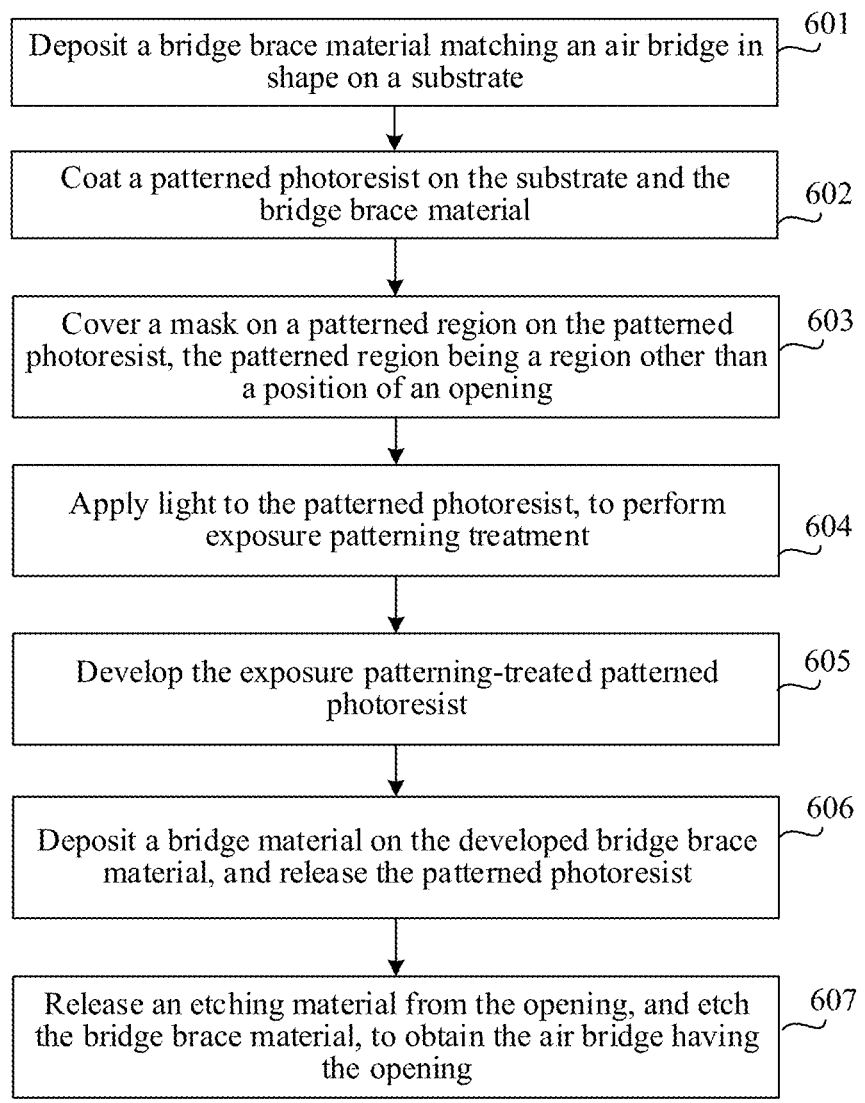
FIG. 6 is a flowchart of a method for fabricating an air bridge corresponding to a method A according to an exemplary embodiment of this disclosure.

First, descriptions are provided for a method for fabricating an air bridge corresponding to the method A. FIG. 6 is a flowchart of a method for fabricating an air bridge according to another exemplary embodiment of this disclosure. As shown in FIG. 6, the method includes the following steps:

At Step 601. A bridge brace material matching the air bridge in shape is deposited on a substrate.

The bridge brace material matches the air bridge in shape, that is, by depositing a bridge material on the bridge brace material, an air bridge with an accurate bridge body shape can be directly obtained.

In some embodiments, in the process of depositing the bridge brace material, a patterned photoresist needs to be coated on the substrate first. The patterned photoresist is used for obtaining a deposition region of the bridge brace material through exposure and development. That is, according to a position of the air bridge on the substrate, the patterned photoresist is exposed and developed, to obtain the deposition region of the bridge brace material, and the bridge brace material matching the air bridge in shape is deposited in the deposition region on the substrate.

In some examples, a primer photoresist is coated on the substrate, and the patterned photoresist is coated on the primer photoresist A development manner of the primer photoresist is different from that of the patterned photoresist, that is, the primer photoresist does not react with a developer of the patterned photoresist. According to the position of the air bridge on the substrate, the patterned photoresist is exposed and developed. After the deposition region of the bridge brace material is obtained, the primer photoresist located in the deposition region also needs to be etched, and the bridge brace material matching the air bridge in shape is deposited in the deposition region on the substrate. Due to the region control of the primer photoresist, shape control of the bridge brace material in the deposition region has higher flexibility and a better effect.

At Step 602. A patterned photoresist is coated on the substrate and the bridge brace material.

In some embodiments, the patterned photoresist is the second photoresist shown in FIG. 5. That is, the second photoresist is coated on the bridge brace material and the substrate again.

In some embodiments, a third photoresist is coated on the substrate and the bridge brace material as the patterned photoresist mentioned above, and the temperature of third baking is a soft baking temperature of the third photoresist. The third photoresist and the second photoresist are different photoresists. The third photoresist is a negative or reversal photoresist.

At Step 603. A mask is covered on a patterned region on the patterned photoresist, the patterned region is a region other than a position of the opening.

The position of the opening is a position on the patterned photoresist corresponding to the opening on the air bridge. The opening is located at an approach bridge portion of the air bridge; or the opening is located at an approach bridge portion and a pier portion of the air bridge.

That is, when the opening is located at the approach bridge portion, the patterned region includes a first region corresponding to the pier portion, a second region corresponding to a bridge top portion, and a third region corresponding to a non-opening portion of the approach bridge portion; or when the opening is located at the approach bridge portion and the pier portion, the patterned region includes the second region corresponding to the bridge top portion and a fourth region corresponding to a non-opening portion of the approach bridge portion and the pier portion.

At Step 604. Light is applied to the patterned photoresist, to perform the exposure patterning treatment.

The exposure process includes ultraviolet exposure or laser direct writing, and the baking temperature is a prebaking temperature of the third photoresist.

At Step 605. The exposure patterning-treated patterned photoresist is developed.

In some examples, by developing the exposure patterning-treated patterned photoresist, patterned etching of the patterned photoresist is finished.

A depositing structure of the air bridge having an opening on the approach bridge and/or the pier is obtained after development and fixation.

At Step 606. A bridge material is deposited on the developed bridge brace material, and the patterned photoresist is released.

At Step 607. An etching material is released (let in) from the opening to etch the bridge brace material.

In some embodiments, the exposure patterning-treated patterned photoresist includes at least two of the following situations:

In the exposure patterning-treated patterned photoresist, the photoresist at the position at which an opening needs to be arranged is retained, and the photoresist at other positions at which the bridge material needs to be deposited is etched. In this way, after the bridge material is deposited, the air bridge having an opening is directly obtained.

In some embodiments, the bridge material is deposited on the developed bridge brace material, the patterned photoresist on a peripheral side of the air bridge is released, the etching material is released from the opening, and the bridge brace material is etched, to obtain the air bridge having an opening.

In some examples, an oxide layer on the substrate is etched and removed first, so as to deposit the bridge material, and after all glue layers and the bridge brace material are released, the air bridge having an opening at the approach bridge portion and/or the pier portion is obtained.

Figure 7:
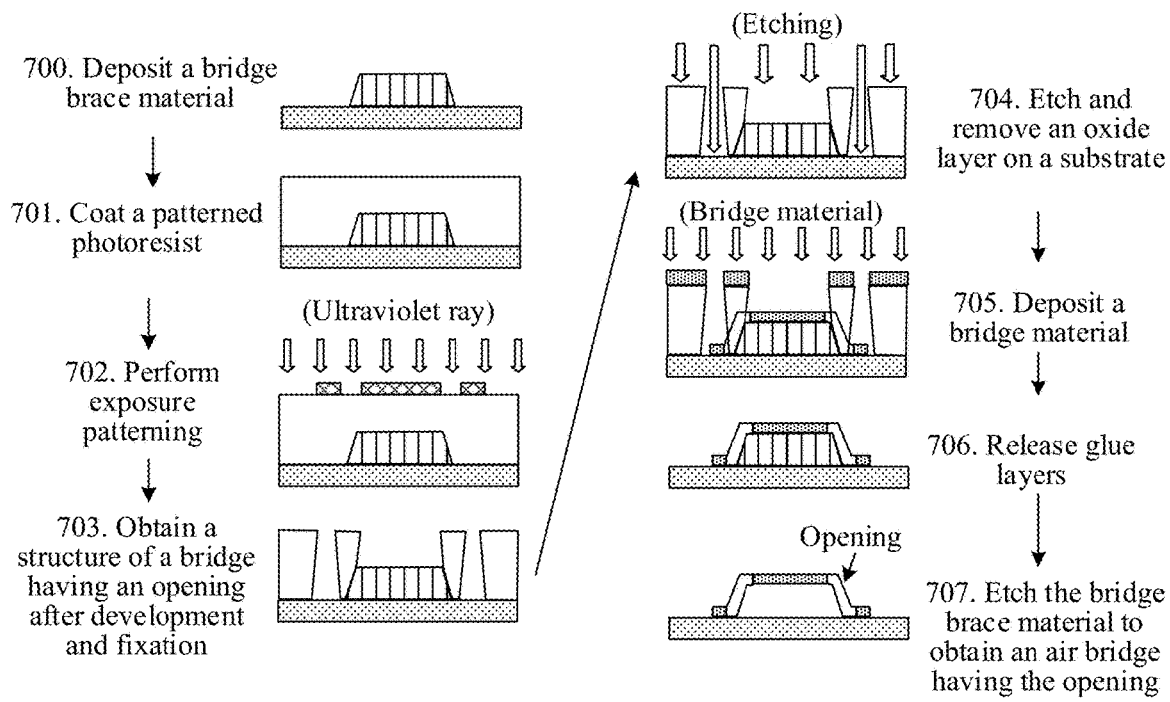
FIG. 7 is an exemplary schematic diagram of a fabrication process of an air bridge corresponding to a method A according to the embodiment shown in FIG. 6.

Illustratively, referring to FIG. 7, the process of fabricating an air bridge corresponding to the method A includes the following steps:

At Step 700. A bridge brace material is deposited. The bridge brace material is deposited in the manner shown in FIG. 5.

At Step 701. A patterned photoresist is coated. The baking temperature is a soft baking temperature of the patterned photoresist.

At Step 702. Exposure patterning is performed. The exposure process includes ultraviolet exposure or laser direct writing. The baking temperature is a pre-baking temperature of the patterned photoresist. Patterned patterns in the patterning process include a separated air bridge pattern and a fully-enclosed air bridge pattern, where the fully-enclosed air bridge is an air bridge having an opening pattern at the pier portion and/or the approach bridge portion.

At Step 703. A structure of a bridge having an opening is obtained after development and fixation.

At Step 704. An oxide layer on a substrate is etched and removed.

At Step 705. A bridge material is deposited. The method for depositing the bridge material includes deposition methods with good directionality control such as electron beam deposition and molecular beam epitaxy.

At Step 706. Glue layers are released (removed). The temperature of lift-off ranges from 20° C. to 100° C., and lift-off methods include a soaking method or an ultrasonic method.

At Step 707. The bridge brace material is etched to obtain an air bridge having the opening. A bridge brace is etched and released selectively. The method used includes hydrofluoric acid (HF) etching. The method of HF etching includes: introducing a catalytic gas first, then introducing an HF gas, and introducing nitrogen after etching, where the catalytic gas includes gaseous water, ethanol, methanol, and isopropanol, and HF is an anhydrous HF gas.

Figure 8:
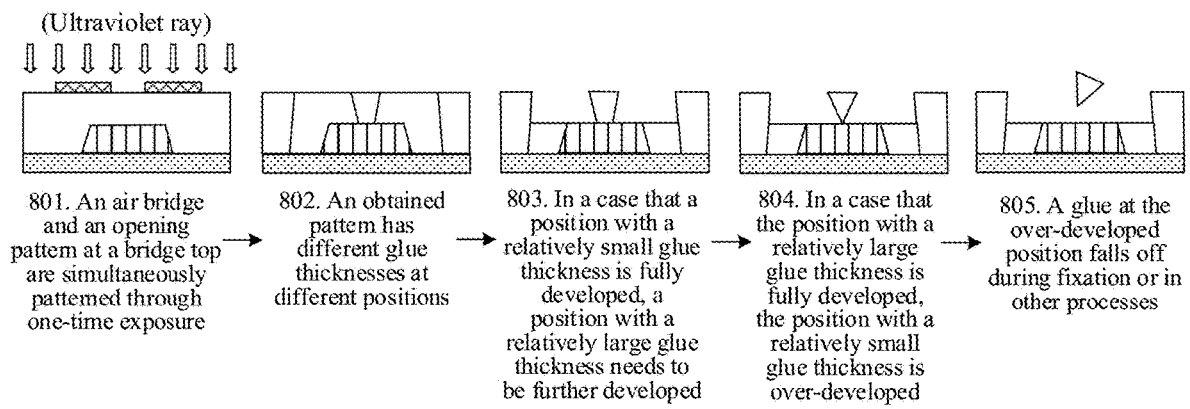
FIG. 8 is a schematic diagram of an exemplary process of arranging an opening at a bridge top portion using a method A according to the embodiment shown in FIG. 6.

However, the foregoing method A can be used for opening arrangement of the approach bridge portion and/or the pier portion, but cannot be applied to opening arrangement of the bridge top portion. Illustratively, reference may be made to a schematic diagram of a process of arranging an opening at a bridge top portion using the method A shown in FIG. 8. As shown in FIG. 8, in this process, first, in 801, an air bridge and an opening pattern at a bridge top are simultaneously patterned through one-time exposure. In 802, an obtained pattern has different glue thicknesses at different positions. In 803, when a position with a relatively small glue thickness is fully developed, a position with a relatively large glue thickness needs to be further developed. In 804, when the position with a relatively large glue thickness is fully developed, the position with a relatively small glue thickness is over-developed. In 805, a glue at the over-developed position falls off during fixation or in other processes.

However, in the process shown in FIG. 7, because the glue has the same maximum thickness at the pattern, although some positions are over-developed, the glue does not fall off.

As described above, in the method for fabricating an air bridge provided in this embodiment, exposure patterning treatment is performed on a patterned photoresist, so as to arrange an opening structure running through a deck on the deck. In addition, in the process of fabricating an air bridge, a bridge brace material is released through the opening structure, and an etching material is released from the position of an opening to etch the bridge brace material. Therefore, the complete release of the bridge brace material is ensured, and bridge brace material residues are prevented from being left inside the bridge hole, thereby improving the overall device quality of the air bridge and the fabrication accuracy of the air bridge.

In the method provided in this embodiment, in the process of arranging an opening, an opening is arranged by coating a photoresist twice. The developing characteristics of the photoresist are used to arrange the opening on an air bridge. In this way, the fabrication efficiency of the air bridge is improved, and the opening is arranged and obtained by applying a relatively small number of times of photoresist coatings.

Figure 9:
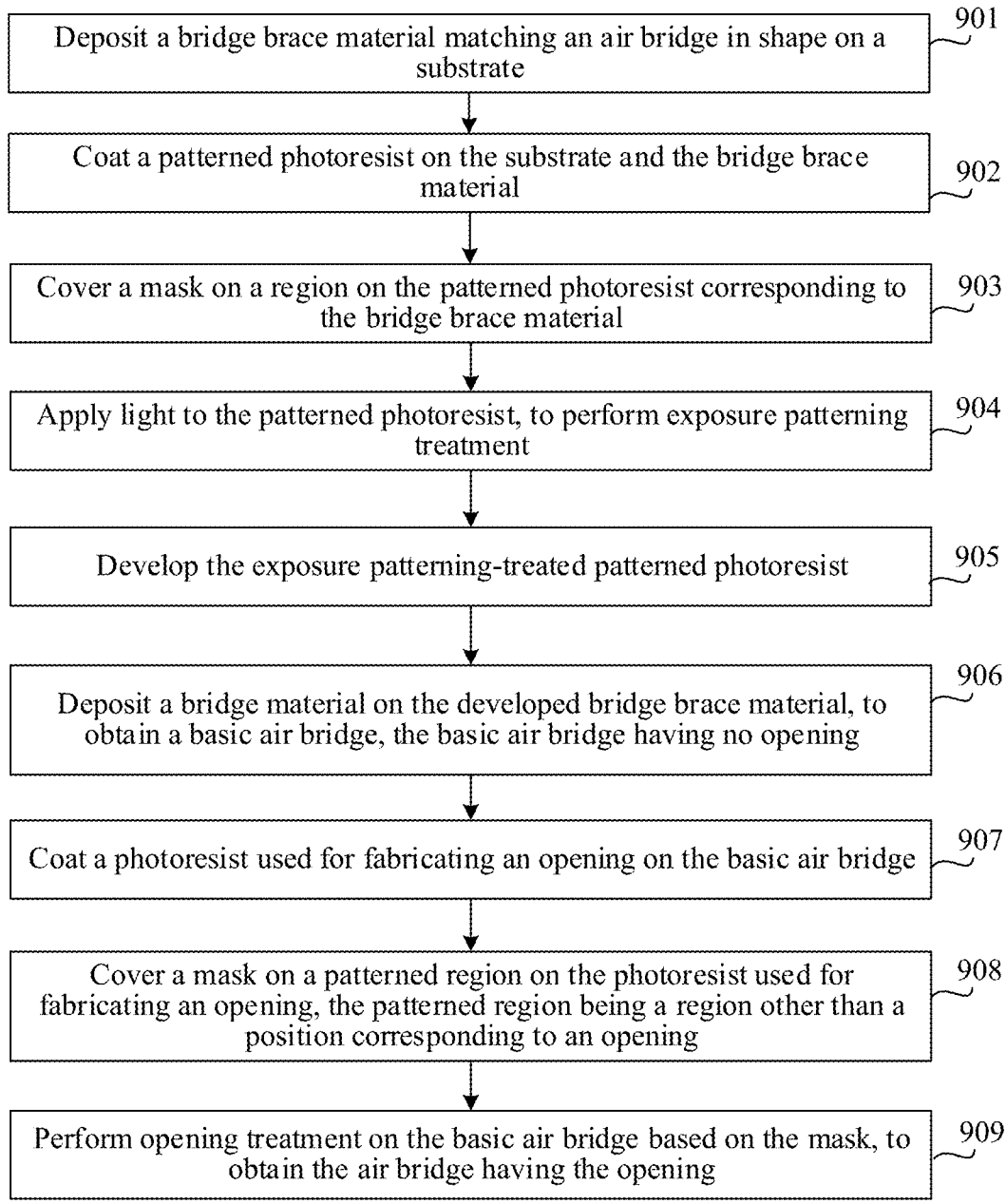
FIG. 9 is a flowchart of a method for fabricating an air bridge corresponding to a method B according to an exemplary embodiment of this disclosure.

Second, descriptions are provided for a method for fabricating an air bridge corresponding to the method B. FIG. 9 is a flowchart of a method for fabricating an air bridge according to another exemplary embodiment of this disclosure. As shown in FIG. 9, the method includes the following steps:

At Step 901. A bridge brace material matching the air bridge in shape on is deposited a substrate.

The bridge brace material matches the air bridge in shape, that is, by depositing a bridge material on the bridge brace material, an air bridge with an accurate shape can be directly obtained.

In some embodiments, in the process of depositing the bridge brace material, a patterned photoresist needs to be coated on the substrate first. The patterned photoresist is used for obtaining a deposition region of the bridge brace material through exposure and development. That is, according to a position of the air bridge on the substrate, the patterned photoresist is exposed and developed, to obtain the deposition region of the bridge brace material, and the bridge brace material matching the air bridge in shape is deposited in the deposition region on the substrate.

In some examples, a primer photoresist is coated on the substrate, and the patterned photoresist is coated on the primer photoresist A development manner of the primer photoresist is different from that of the patterned photoresist, that is, the primer photoresist does not react with a developer of the patterned photoresist. According to the position of the air bridge on the substrate, the patterned photoresist is exposed and developed. After the deposition region of the bridge brace material is obtained, the primer photoresist located in the deposition region also needs to be etched, and the bridge brace material matching the air bridge in shape is deposited in the deposition region on the substrate. Due to the region control of the primer photoresist, shape control of the bridge brace material in the deposition region has higher flexibility and a better effect.

At Step 902. A patterned photoresist is coated on the substrate and the bridge brace material.

In some embodiments, the patterned photoresist is the second photoresist shown in FIG. 5. That is, the second photoresist is coated on the bridge brace material and the substrate again.

In some embodiments, a third photoresist is coated on the substrate and the bridge brace material as the patterned photoresist mentioned above, and the temperature of third baking is a soft baking temperature of the third photoresist. The third photoresist and the second photoresist are different photoresists. The third photoresist is a negative or reversal photoresist.

At Step 903. A mask is used to cover on a region on the patterned photoresist corresponding to the bridge brace material.

That is, the mask is covered on the region on the patterned photoresist corresponding to the bridge brace material, so as to develop the patterned photoresist in the region corresponding to the bridge brace material.

In some embodiments, the mask is covered on a region in the middle of the patterned photoresist corresponding to the air bridge, and the patterned photoresist on both sides are retained.

At Step 904. Light is applied to the patterned photoresist, to perform the exposure patterning treatment.

The exposure process includes ultraviolet exposure or laser direct writing, and the baking temperature is a pre-baking temperature of the third photoresist.

At Step 905. The exposure patterning-treated patterned photoresist is developed.

In some examples, by developing the exposure patterning-treated patterned photoresist, patterned etching of the patterned photoresist is finished.

At Step 906. The bridge material is deposited on the developed bridge brace material, to obtain a basic air bridge, the basic air bridge has no opening.

The method for depositing the bridge material includes deposition methods with good directionality control such as electron beam deposition and molecular beam epitaxy.

After the basic air bridge is obtained, all glue layers are released. The temperature of lift-off ranges from 20° C. to 100° C., and the lift-off method may be a soaking method or an ultrasonic method.

At Step 907. A photoresist used for fabricating an opening is coated on the basic air bridge.

The photoresist used for fabricating an opening is a positive photoresist, and the baking temperature is a soft baking temperature of the photoresist used for fabricating an opening.

The patterned photoresist, the photoresist used for fabricating an opening, and the primer photoresist mentioned above are merely illustrative names, and the specific glue layer materials used therein may be the same or different, which is not limited in the embodiments of this disclosure.

At Step 908. A mask is used to cover a patterned region on the photoresist used for fabricating an opening, the patterned region being a region other than a position corresponding to the opening.

The opening is located at an approach bridge portion of the air bridge; or the opening is located at an approach bridge portion and a pier portion of the air bridge; or the opening is located at a bridge top portion of the air bridge; or the opening is located at a bridge top portion and an approach bridge portion of the air bridge; or the opening is located at a bridge top portion, an approach bridge portion, and a pier portion of the air bridge.

That is, when the opening is located at the approach bridge portion, the patterned region includes a region corresponding to the pier portion and the bridge top portion; when the opening is located at the approach bridge portion and the pier portion, the patterned region includes a region corresponding to the bridge top portion; when the opening is located at the bridge top portion, the patterned region includes a region corresponding to the approach bridge portion and the pier portion; when the opening is located at the bridge top portion and the approach bridge portion, the patterned region includes a region corresponding to the pier portion, and the mask is covered on the patterned region; or when the opening is located at the bridge top portion, the approach bridge portion, and the pier portion, the mask is covered on a connection portion between any two portions, or no mask is covered on this region. In some embodiments, the air bridge is cut off in a manner of not covering the mask every predetermined distance, so as to directly obtain a plurality of separated air bridges.

At Step 909. Opening treatment on the basic air bridge is performed based on the mask, to obtain the air bridge having the opening.

In some embodiments, light is applied to the photoresist used for fabricating an opening, the photoresist used for fabricating an opening is exposed, and the exposed photoresist used for fabricating an opening is developed, to obtain an opening pattern of the air bridge. Etching is performed on the basic air bridge based on the opening pattern, and the photoresist used for fabricating an opening on a peripheral side of the air bridge is released. An etching material is released from the opening, and the bridge brace material is etched, to obtain the air bridge having the opening.

This embodiment of this disclosure mainly aims at a fully-enclosed air bridge, that is, opening treatment is performed on a continuously connected air bridge every predetermined distance.

Figure 10:
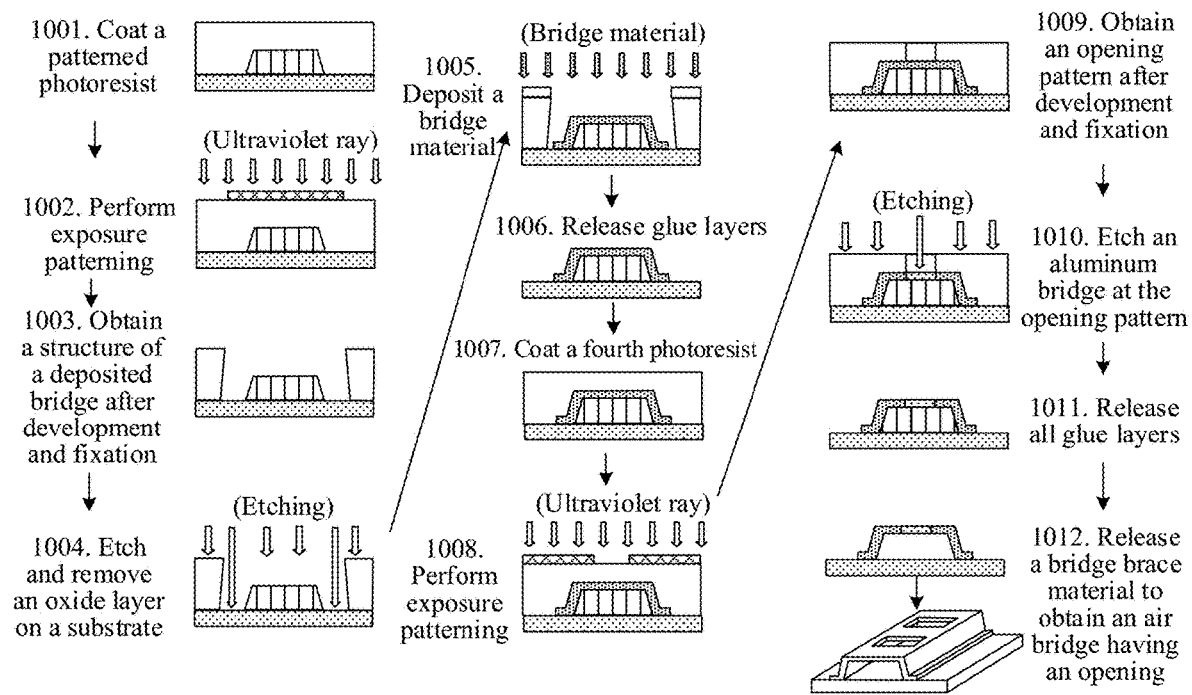
FIG. 10 is an exemplary schematic diagram of a fabrication process of an air bridge corresponding to a method B according to the embodiment shown in FIG. 9.

Illustratively, referring to FIG. 10, the process of fabricating an air bridge corresponding to the method B includes the following steps:

At Step 1001. A patterned photoresist is deposited. The baking temperature is a soft baking temperature of the patterned photoresist.

At Step 1002. Exposure patterning is performed. The exposure process includes ultraviolet exposure or laser direct writing, and the baking temperature is a pre-baking temperature of the patterned photoresist.

At Step 1003. A structure of a deposited bridge is obtained after development and fixation.

At Step 1004. An oxide layer on a substrate is etched and removed.

At Step 1005. A bridge material is deposited. The method for depositing the bridge material includes deposition methods with good directionality control such as electron beam deposition and molecular beam epitaxy.

At Step 1006. Glue layers are released (removed). The temperature of lift-off ranges from 20° C. to 100° C., and the lift-off method may be a soaking method or an ultrasonic method.

At Step 1007. A fourth photoresist is coated. The fourth photoresist is a positive photoresist, and the baking temperature is a soft baking temperature of the fourth photoresist.

At Step 1008. Exposure patterning is performed. The exposure process includes ultraviolet exposure or laser direct writing.

At Step 1009. An opening pattern is obtained after development and fixation.

At Step 1010. An aluminum bridge is etched based on the opening pattern. The etching method may be physical etching, chemical etching, or a combination of physical etching and chemical etching. The physical etching includes ion beam etching, and the ion beam used is argon/helium ions. The chemical etching includes wet etching and dry etching. The solution used for wet etching includes phosphoric acid and Type A, and the etching gas used for dry etching includes chlorine gas and boron trichloride.

At Step 1011. All glue layers are released (removed). The temperature of lift-off ranges from 20° C. to 100° C., and the lift-off method may be a soaking method or an ultrasonic method.

At Step 1012. The bridge brace material is released (removed) to obtain an air bridge having an opening. A bridge brace is etched and released selectively. The method used includes hydrofluoric acid (HF) etching. The method of HF etching includes: introducing a catalytic gas first, then introducing an HF gas, and introducing nitrogen after etching, where the catalytic gas includes gaseous water, ethanol, methanol, and isopropanol, and HF is an anhydrous HF gas.

Figure 11:
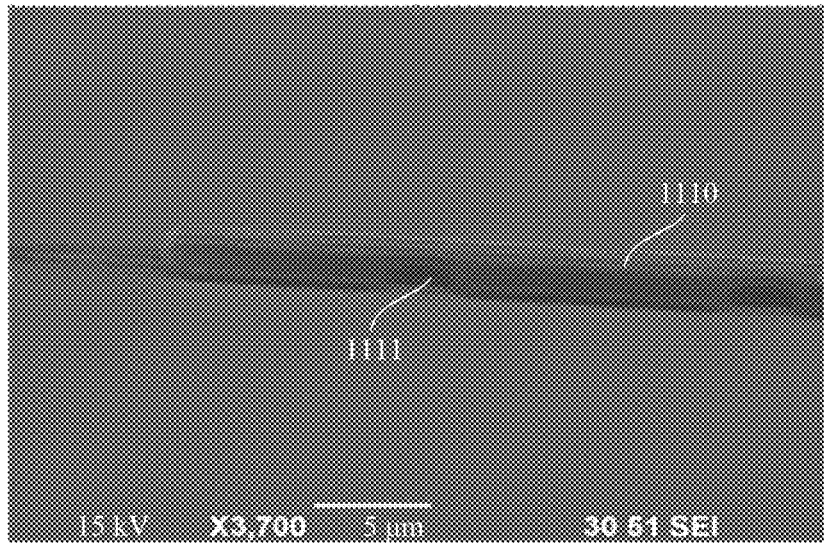
FIG. 11 is an electron micrograph of an opening of a fully-enclosed air bridge according to an exemplary embodiment of this disclosure.

Illustratively, using the opening at the approach bridge portion as an example, an electron micrograph of the obtained fully-enclosed air bridge is shown in FIG. 11. With regard to the electron micrograph, an acceleration voltage is 15 kV, a magnification is 3700 times, a working distance is 5 and an SE1 detector is used. The air bridge 1110 has an opening 1111. According to the electron micrograph, it can be learned that the bridge brace material inside the opening 1111 is released almost completely.

Illustratively, an exemplary embodiment is provided for the foregoing method B:

PMMA is coated on the substrate as a primer after a substrate is washed, and is baked at 180° C. for a period of time. An AZ-series reversal photoresist is coated on the primer, and is baked at 95° C. for a period of time. Ultraviolet exposure is performed, pre-baking is performed at 95° C., and then flood exposure is performed for a period of time, to obtain, after development and fixation, a photoresist structure used for depositing and lifting off a bridge brace. Oxygen plasma is used to etch the primer for a period of time, to form an opening similar to a deposited pattern in size on the primer. At room temperature, a silica film is evaporated as a bridge brace by using an electron beam evaporation method.

A sample is placed in acetone to lift off the photoresist, to obtain the bridge brace on the substrate. The AZ-series reversal photoresist is coated on the obtained bridge brace sample, and is baked at 95° C. for a period of time. Ultraviolet exposure is performed, pre-baking is performed at 95° C., and then flood exposure is performed for a period of time, to obtain, after development and fixation, a photoresist structure used for depositing and lifting off an air bridge. For a fully-enclosed air bridge, the patterned photoresist structure has an opening pattern at a pier portion and an approach bridge portion; or has an opening pattern at a bridge top portion; or has an opening pattern at a pier portion, an approach bridge portion, and a bridge top portion.

The residual glue and oxide layer on the substrate are removed by using ion beam etching, to increase the connectivity between the deposited air bridge and a circuit on the substrate. An aluminum film with a specific thickness is deposited through electron beam evaporation. The sample is placed in acetone for lift-off, to obtain an air bridge with a bridge brace. An AZ-series positive photoresist is further coated on the sample, and is baked at 100° C. for a period of time. Ultraviolet exposure is performed, and an opening pattern is obtained on the positive photoresist after development and fixation. The sample is placed in an aluminum corrosive solution to etch away the aluminum film at the opening. The sample is placed in acetone for lift-off, to obtain the bridge brace and an air bridge having an opening. The sample is placed in an HF etching machine, gaseous ethanol is first introduced, then an anhydrous HF gas is introduced for a period of time, and finally, nitrogen is introduced, to completely release the silica bridge brace. Since the pier portion and the approach bridge portion of the fully-enclosed air bridge have the opening, the silica bridge brace in a bridge hole can be released completely. Finally, the fully-enclosed air bridge having an opening is obtained.

In some embodiments, a separated air bridge may further be fabricated by using the principle of fabricating a fully-enclosed air bridge having an opening at the bridge top. That is, the air bridge can be divided by expanding the opening range until the opening runs through the entire air bridge transversely.

As described above, in the method for fabricating an air bridge provided in this embodiment, exposure patterning treatment is performed on a patterned photoresist, so as to arrange an opening structure running through a deck on the deck. In addition, in the process of fabricating an air bridge, a bridge brace material is released through the opening structure, and an etching material is released from the position of an opening to etch the bridge brace material. Therefore, the complete release of the bridge brace material is ensured, and bridge brace material residues are prevented from being left inside the bridge hole, thereby improving the overall device quality of the air bridge and the fabrication accuracy of the air bridge.

In the method provided in this embodiment, a plurality of different opening manners can satisfy the fabrication of fully-enclosed air bridges with different requirements. Two different methods for fabricating an air bridge are provided to satisfy air bridge solutions with different fabrication requirements. The damage of an etching gas to other devices caused by an excessively long release time of a bridge brace in a related process is avoided. The bridge brace release process has a good effect, and the composition of the etching gas does not need to be changed. The etching gas can be released through the opening to achieve the release of the bridge brace without leaving bridge brace residue. The whole process does not cause damage to other devices and structures on the substrate, and maintains the good shape and performance of a sample. Compared with the design without an opening, the design with an opening introduced can avoid structural damage, such as a dent or a fracture, at the straight and curved portions of the fully-enclosed air bridge. The methods are applicable to fabricating an air bridge of an FC, particularly to fabricating a fully-enclosed air bridge of a superconducting quantum FC.

In an embodiment, this disclosure further provides a superconducting quantum chip. The superconducting quantum chip includes a substrate and a quantum circuit integrated on the substrate. The superconducting quantum chip further includes the air bridge structure according to the foregoing embodiments.

The method for fabricating an air bridge provided in the embodiments of this disclosure may be implemented manually, or may be implemented by a machine through automatic control.

The method for fabricating an air bridge implemented by a machine through automatic control is used as an example. Illustratively, the embodiments of this disclosure further provide a manufacturing device for an air bridge. The manufacturing device includes a processor and a memory, the memory storing at least one program, the at least one program, run and loaded on the processor, implementing the method for fabricating an air bridge provided in the embodiments of this disclosure.

The foregoing descriptions are embodiments of the present disclosure, but are not intended to limit the present disclosure. Any modification, equivalent replacement, or improvement made within the spirit and principle of the present disclosure shall fall within the protection scope of the present disclosure.

What is claimed is:

1. A method for fabricating an air bridge, comprising:
   forming an air bridge brace structure on a substrate;
   forming, on the air bridge brace structure and the substrate, an air bridge material layer with one or more openings in the air bridge material layer that reveal the air bridge brace structure, the air bridge material layer with the one or more openings being formed based on a patterned photoresist layer with patterns corresponding to the one or more openings; and removing, based on the one or more openings in the air bridge material layer, the air bridge brace structure to obtain the air bridge having the one or more openings, wherein the one or more openings includes at least one of an opening in an approach bridge portion of the air bridge or an opening in a pier portion of the air bridge.

2. The method according to claim 1, wherein the forming the air bridge material layer comprises:

forming a base air bridge without the one or more openings;

forming the patterned photoresist layer over the base air bridge with the patterns that reveal regions of the base air bridge corresponding to the one or more openings; and etching the base air bridge based on the patterned photoresist layer to remove the regions of the base air bridge corresponding to the one or more openings.

3. The method according to claim 2, wherein the one or more openings further include an opening in a bridge top portion for the air bridge.

4. The method according to claim 2, wherein the patterned photoresist layer is a fourth patterned photoresist layer, and forming the base air bridge without the one or more openings further comprises:

forming a third patterned photoresist layer over the air bridge brace structure and the substrate, the third patterned photoresist layer having a pattern that reveals a region for the base air bridge;

depositing a material for the air bridge over the third patterned photoresist layer, the pattern allowing the material for the air bridge being deposited in the region for the base air bridge; and removing the third patterned photoresist layer to form the base air bridge.

5. The method according to claim 2, wherein the patterned photoresist layer is a fourth patterned photoresist layer and the forming the patterned photoresist layer further comprises:

coating a fourth photoresist layer on the base air bridge; and exposing and developing based on a mask to generate the patterns in the fourth photoresist layer to reveal the regions of the base air bridge corresponding to the one or more openings.

6. The method according to claim 1, wherein the forming the air bridge material layer comprises:

forming the patterned photoresist layer over the air bridge brace structure with the patterns that block regions on the air bridge brace structure under the one or more openings;

depositing a material for the air bridge over the patterned photoresist layer, the patterns blocking the material from being deposited on the regions on the air bridge brace structure under the one or more openings; and removing the patterned photoresist layer to form the air bridge material layer with the one or more openings.

7. The method according to claim 6, wherein the patterned photoresist layer is a third patterned photoresist layer and the forming the patterned photoresist layer further comprises:

coating a third photoresist layer on the air bridge brace structure and the substrate; and exposing and developing the third photoresist layer based on a mask to generate the patterns in the third photoresist layer to block the regions of the air bridge brace structure under the one or more openings.

8. The method according to claim 1, wherein the forming the air bridge brace structure on the substrate further comprises:

coating a first photoresist layer on the substrate;

coating a second photoresist layer over the first photoresist layer to form a stack of photoresist, the first photoresist layer being not subjected to a developing of the second photoresist layer;

forming an opening in the stack of photoresist that reveals the substrate;

depositing a material for the air bridge brace structure in the opening; and removing the stack of photoresist.

9. The method according to claim 8, wherein the forming the opening in the stack of photoresist further comprises:

exposing and developing the second photoresist layer based on a mask to generate an initial opening corresponding to the opening in the second photoresist layer; and etching the first photoresist layer based on the initial opening in the second photoresist layer.

10. The method according to claim 1, wherein the forming the air bridge material layer comprises:

forming the air bridge material layer as a continuous layer with multiple openings for a fully-enclosed air bridge.

11. The method according to claim 10, wherein the multiple openings are disposed along a width direction of the air bridge.

12. The method according to claim 10, wherein a distance between two neighboring openings is predefined.

13. The method according to claim 1, wherein the forming the air bridge material layer further comprises:

forming the air bridge material layer with an opening that extends in a length direction of the air bridge, the opening dividing the air bridge material layer into a first portion corresponding to a first air bridge, and a second portion corresponding to a second air bridge.

* * * * *